US008248836B2

(12) United States Patent
Jin et al.

(10) Patent No.: US 8,248,836 B2
(45) Date of Patent: Aug. 21, 2012

(54) NON-VOLATILE MEMORY CELL STACK WITH DUAL RESISTIVE ELEMENTS

(75) Inventors: Insik Jin, Eagan, MN (US); YoungPil Kim, Eden Prairie, MN (US); Ming Sun, Eden Prairie, MN (US); Chulmin Jung, Eden Prairie, MN (US); Venugopalan Vaithyanathan, Bloomington, MN (US); Nurul Amin, Woodbury, MN (US); Wei Tian, Bloomington, MN (US); Yong Lu, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 235 days.

(21) Appl. No.: 12/501,751

(22) Filed: Jul. 13, 2009

(65) Prior Publication Data

US 2011/0007545 A1    Jan. 13, 2011

(51) Int. Cl.
*G11C 11/00* (2006.01)
*G11C 11/14* (2006.01)
*G11C 7/00* (2006.01)

(52) U.S. Cl. .. 365/148; 365/171; 365/163; 365/189.011

(58) Field of Classification Search .................. 365/148, 365/171, 173, 189.011, 189.04; 257/4, E45.003
See application file for complete search history.

(56) References Cited

U.S. PATENT DOCUMENTS

| | | | |
|---|---|---|---|
| 6,456,524 B1 | 9/2002 | Perner et al. | |
| 7,060,586 B2 | 6/2006 | Li et al. | |
| 7,236,394 B2 | 6/2007 | Chen et al. | |
| 7,251,154 B2 | 7/2007 | Hush | |
| 7,286,378 B2 | 10/2007 | Nazarian | |
| 7,400,027 B2 | 7/2008 | Joung et al. | |
| 7,433,253 B2 | 10/2008 | Gogl et al. | |
| 2006/0131554 A1* | 6/2006 | Joung et al. | 257/2 |
| 2006/0139992 A1* | 6/2006 | Hwang et al. | 365/158 |
| 2008/0273370 A1* | 11/2008 | Keller et al. | 365/148 |
| 2010/0046285 A1* | 2/2010 | Lung | 365/163 |

\* cited by examiner

*Primary Examiner* — Alexander Sofocleous
*Assistant Examiner* — Hai Pham
(74) *Attorney, Agent, or Firm* — Hall Estill Attorneys at Law (57) ABSTRACT

A non-volatile memory cell and method of use thereof. In some embodiments, an individually programmable resistive sense memory (RSM) element is connected in series with a programmable metallization cell (PMC) switching element. In operation, while the switching element is programmed to a first resistive state, no current passes through the RSM element and while a second resistive state is programmed to the RSM element, current passes through the RSM element.

19 Claims, 6 Drawing Sheets

PMC CONSTRUCTION

PCRAM CONSTRUCTION

NON-VOLATILE MEMORY CELL STACK WITH DUAL RESISTIVE ELEMENTS

BACKGROUND

Data storage devices generally operate to store and retrieve data in a fast and efficient manner. Some storage devices utilize a semiconductor array of solid-state memory cells to store individual bits of data. Such memory cells can be volatile or non-volatile.

Volatile memory cells generally retain data stored in memory only so long as power continues to be supplied to the device, while non-volatile memory cells generally retain data storage in memory even in the absence of the application of power.

Some non-volatile memory cell constructions include a resistive sense memory element that can be programmed to different resistance states, such as a high resistance or a low resistance. Different logical states are assigned to the different resistance states of the cell, such as a logical 1 to the low resistance state and a logical 0 to the high resistance state (or 00, 01, 10, 11 in some multi-bit designs). Such elements can be bipolar in that write currents to program the respective states are applied in opposite directions through the cell.

A switching device, such as a metal oxide semiconductor field effect transistor (MOSFET), may be incorporated into the memory cell to accommodate the bipolar memory element write currents. Such integrated switching devices can be relatively large with respect to the memory elements, and therefore the size of the switching devices can limit the ability to achieve higher data areal densities in a memory array.

SUMMARY

Various embodiments of the present invention are generally directed to a non-volatile memory cell, and a method of programming the memory cell.

In accordance with some embodiments, the memory cell comprises a programmable bipolar resistive sense memory element connected in series with a programmable resistive switching element. The memory cell is configured such that application of a write current to place the memory element in a selected resistive state places the switching element in a high resistive state.

In accordance with further embodiments, the method generally comprises providing a non-volatile memory cell comprising a programmable bipolar resistive sense memory element connected in series with a programmable resistive switching element. The memory element is programmed in a selected resistive state by applying a write current through the memory cell, wherein the write current also places the switching element in a high resistive state.

In other embodiments, an individually programmable resistive sense memory (RSM) element is connected in series with a programmable metallization cell (PMC) switching element. In operation, while the switching element is programmed to a first resistive state, no current passes through the RSM element and while a second resistive state is programmed to the RSM element, current passes through the RSM element.

These and other features and advantages which characterize the various embodiments of the present invention can be understood in view of the following detailed discussion and the accompanying drawings.

DETAILED DESCRIPTION

Figure 1:
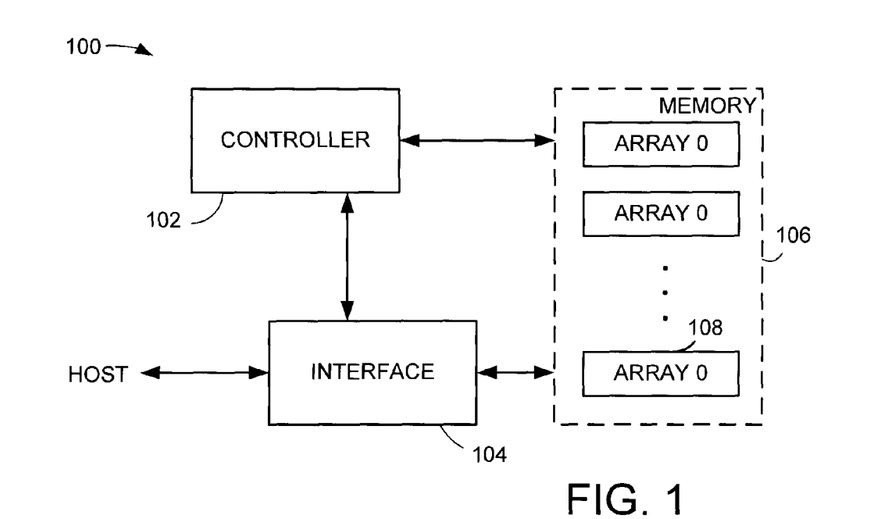
FIG. 1 shows exemplary data storage device constructed and operated in accordance with various embodiments of the present invention.

FIG. 1 provides a functional block representation of a data storage device 100 constructed and operated in accordance with various embodiments of the present invention. In some embodiments, the device 100 can be characterized as a non-volatile solid-state drive (SSD). Top level control of the device 100 is carried out by a suitable controller 102, which may be a programmable or hardware based microcontroller. The controller 102 communicates with a host device via a controller interface (I/F) circuit 104.

A memory space is shown at 106 to comprise a number of memory arrays 108 (denoted Arrays 0-N). Each array 108 comprises a block of non-volatile semiconductor memory of selected storage capacity. A single array 108 can be used as desired.

Figure 2A:
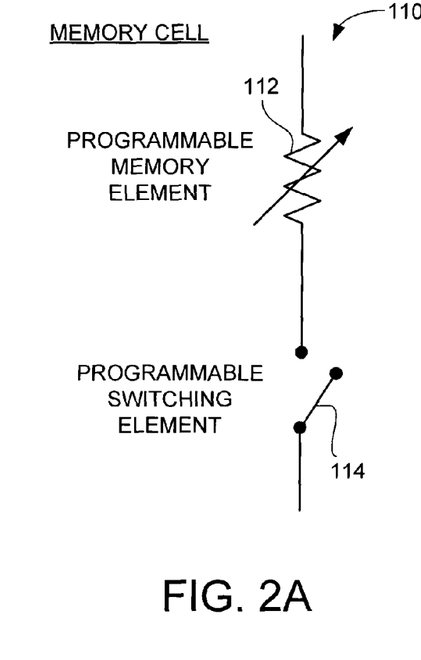
FIGS. 2A-2C show exemplary configurations of a memory cell of an array of FIG. 1.

An exemplary memory cell 110 of the memory space 106 is shown in FIG. 2A. In accordance with various embodiments, the memory cell 110 comprises a bipolar resistive sense memory element 112 coupled to a resistive switching element 114. The bipolar memory element 112 is selectively programmable to different resistance states (such as a high electrical resistance or a low electrical resistance) to store different logical values, such as a logical 0 or a logical 1. The resistance levels can alternatively be configured to store multiple bits; for example, programmable resistances $R1<R2<R3<R4$ of the memory element 112 can be used to respectively store bit values of 00, 01, 10 and 11.

The switching element 114 is also selectively programmable between a low resistance state and a high resistance state, and operates to facilitate access to the memory element 112 during write and read operations. It should be noted that the switching element 114 is not limited to a particular type as either unipolar or bipolar elements can be used either exclusively or assorted.

As used herein, the term "bipolar" describes an element that can be programmed to different resistance states by the application of write currents of opposing polarity (opposing directions) through the element. The term "unipolar" describes an element that can be programmed to different resistive states by the application of write currents of the same polarity (same direction) through the element.

As will be appreciated, some types of memory element constructions are bipolar in nature, others are unipolar in nature, and still others can be configured to operate in either mode. Thus, "bipolar" and "unipolar" as used herein will describe the actual modes in which the respective elements are affirmatively programmed during operation, irrespective of whether the elements could be programmed using a different mode.

Figure 2B:
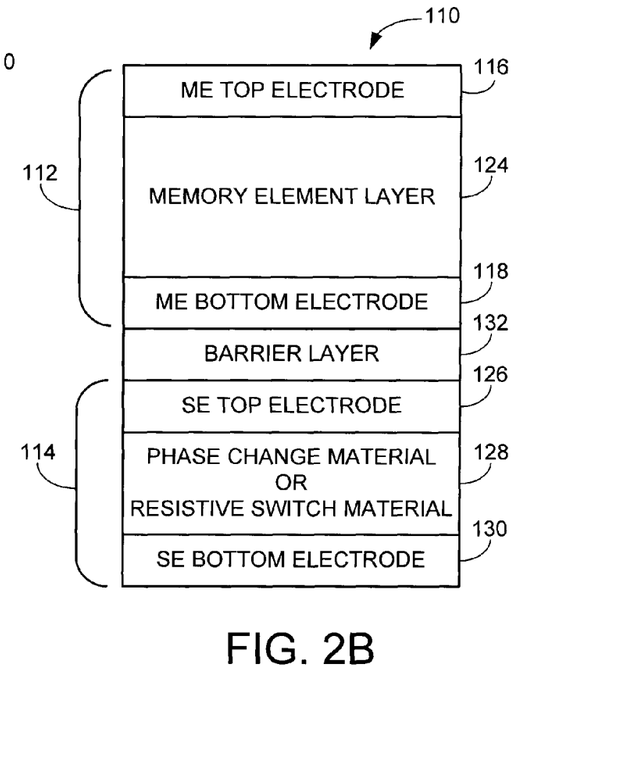
Figure 2C:
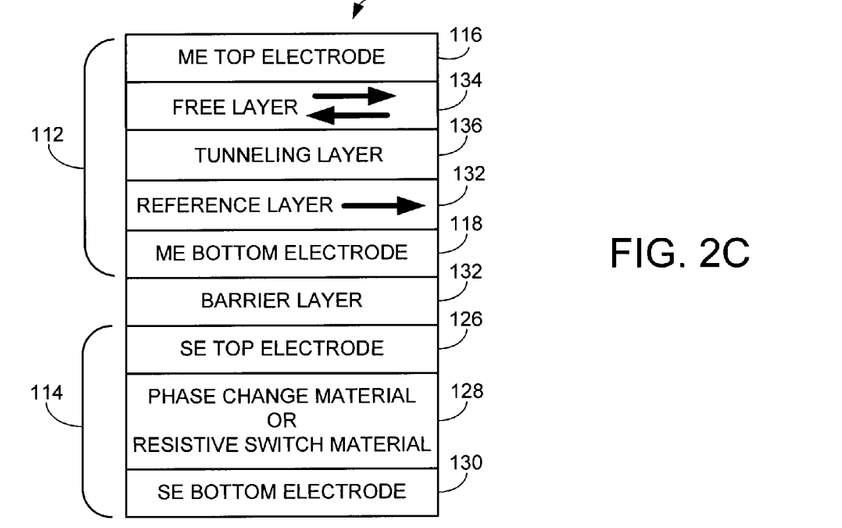

As shown in FIG. 2B, the memory cell 110 can be arranged as a space efficient stack of semiconductor layers. Memory cell 110 comprises memory element layer 124 to facilitate data storage. In some embodiments, the memory element 112 is characterized as a magnetic tunneling junction (MTJ) of a spin-torque transfer random access memory (STRAM), although other configurations can be used. Memory cell 110 includes top and bottom memory element (ME) electrode layers 116 and 118. Between the electrode layers, in a magnetic tunneling junction embodiment, magnetic element layer 124 has a reference layer 132, a free layer 134, and a tunneling barrier layer 136, as shown in FIG. 2C.

The reference layer 132 is provided with a fixed magnetic orientation in a selected direction such as pinning to a separate magnet layer (not separately shown). The magnetic orientation of the free layer 134 is selectively programmable to be in the same direction as the reference layer 132 (parallel) or in the opposite direction as the reference layer 132 (anti-parallel). The parallel orientation provides a first resistive state, such as a low resistance $R_L$. The anti-parallel orientation provides a second resistive state, such as a high resistance $R_H$.

The respective low and high resistive states can be obtained by applying write currents in opposing directions through the MTJ. In some embodiments, application of a write current that passes from the free layer 134 to the reference layer 132 will program the parallel state, and application of a write current that passes from the reference layer 132 to the free layer will program the anti-parallel state.

In further embodiments, the switching element 114 comprises a phase change random access memory (PCRAM), a programmable metallization cell (PMC), or a resistive random access memory (ReRAM or RRAM). However, as before, other configurations can be used.

The exemplary switching element 114 in FIG. 2B includes a top switching element (SE) electrode layer 126, a phase change material (in the case of PCRAM) or resistive switch material (in the case of RRAM or PMC) 128, and a bottom SE electrode layer 130. An intervening barrier layer 132 can be provisioned between the respective memory and switching elements 112, 114. In some embodiments, the switching element 114 can comprise a thin film layer such as $NiO_x$, $TiO_x$, $CuO_x$, $NbO_x$, $TaO_x$, or $Nb:SrTiO_3$.

The use of a memory cell construction made up of a bipolar memory element coupled to a switching element as shown in FIGS. 2A-2B provides a number of operational advantages. One such advantage is elimination of the need to incorporate an integrated switching element such as a MOSFET in each memory cell. This can facilitate significantly higher achievable data array densities, and reduced array connection and control complexities.

Figure 3A:
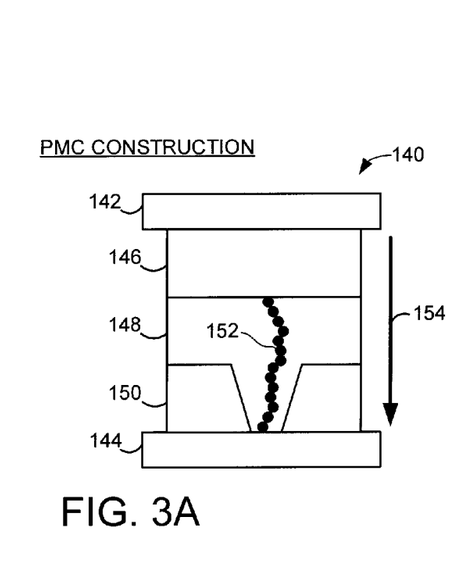
FIGS. 3A-3B show an exemplary programmable metallization cell (PMC) construction.
Figure 3B:
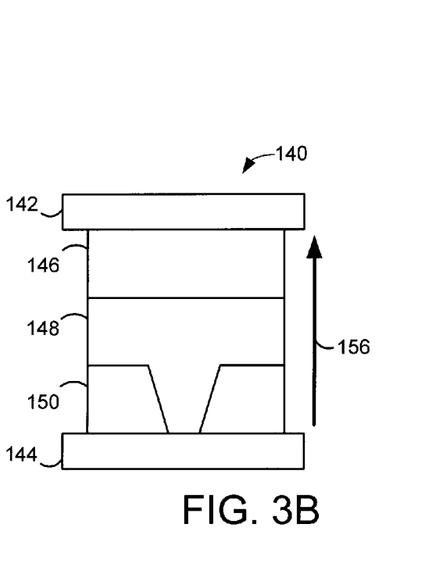

FIGS. 3A-3B illustrate an exemplary programmable metallization cell (PMC) element 140 suitable for use as switching element 114 or the bipolar memory element 112 of FIG. 2A. The PMC element 140 includes top and bottom electrodes 142, 144, a metal layer 146, an electrolyte layer 148 and a dielectric layer 150. Control circuitry (not shown) can be used to adjust the relative voltage potential between the first and second electrodes 142, 144, resulting in passage of a write current 152 through the PMC element 140 to form a filament 154.

The filament 154 establishes an electrically conductive path between the metal layer 146 and the bottom electrode 144 by the migration of ions from the metal layer 166 and electrons from the bottom electrode 144. The dielectric layer 150 focuses a small area of electron migration from the bottom electrode 144 in order to control the position of the resulting filament 154. The filament reduces the effective resistance of the PMC element 140 to a relatively low resistance, which can be assigned a selected logical value such as logical 1.

Subsequent application of a write current 156 in a second direction through the PMC element causes migration of the ions and electrons back to the respective electrodes 142, 144, as shown in FIG. 3B. This resets the PMC element 140 to its initial high electrical resistance, which can be assigned a different logical value such as logical 0. PMC elements with a construction similar to that shown at 140 can alternatively be programmed using unipolar programming currents of different magnitudes and/or pulse widths.

Figure 4A:
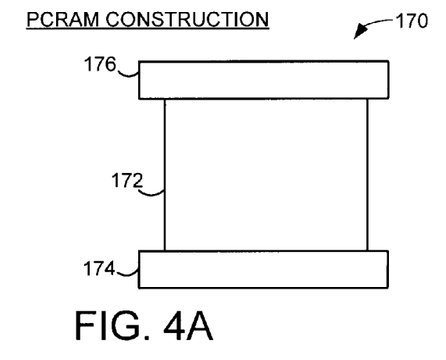
FIGS. 4A-4B show an exemplary phase change random access memory (PCRAM) construction.
Figure 4B:
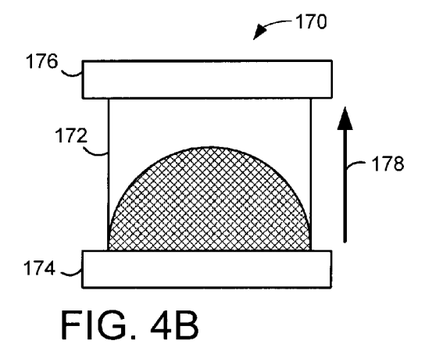

FIGS. 4A-4B provide an exemplary PCRAM element 170 (or "phase change element") suitable for use as the unipolar switching device 114 of FIG. 2A. The phase change element 160 includes a phase change layer 172 disposed between top and bottom electrodes 174, 176. The phase change layer 172 can be formed of a polycrystalline chalcogenide material of group VI of the periodic table, such as Tellurium (Te) and Selenium (Se). In some embodiments, the phase change layer 172 is formed of $Ge_2Sb_2Te_5$ (GST) or In—Ge—Te.

The phase change layer 172 transitions between crystallized and amorphous phases in response to joule heating caused by the passage of a suitable current through the element 170. To place the layer 172 into the amorphous phase, a relatively high voltage potential is applied across the electrodes 174, 176 to heat the layer 172 above its melting temperature. The voltage is removed rapidly so as to provide a relatively sharp cooling transition (referred to as a quenching process). In such case, the atoms may not have sufficient time to relax and fully array into a crystalline lattice structure, thereby ending in a metastable amorphous phase with a high resistance, as depicted in FIG. 3B.

The layer 172 is placed into the crystalline phase by applying a write current of relatively lower and longer duration. The applied pulse is configured to raise the temperature of the layer so as to be above its glass transition temperature and below its melting temperature, and to gradually decrease in temperature back to ambient level. This will generally provide sufficient dwell time for the material to crystallize, as depicted in FIG. 3A. Programming currents to place the layer 172 in the respective amorphous and crystalline phases can both be applied in a common direction (uniform polarity) 178.

Figure 5:
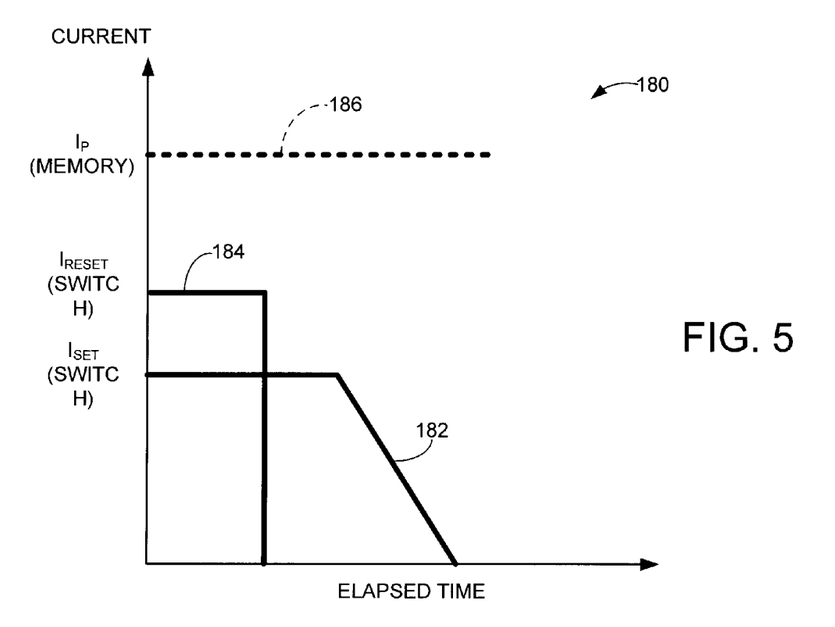
FIG. 5 provides a current vs. time curve to selectively program a switching element of the memory cell of FIGS. 2A-2B.

FIG. 5 shows a current vs. elapsed time curve 180 used to program the switching element 114 to different resistive states. It is contemplated that the curve 180 can correspond to a phase change construction for the switching element 114 as depicted in FIGS. 4A-4B, although such is not limiting. A set portion 182 of the curve 180 provides a set current $I_{SET}$ used to set the switching element 114 to a low resistance state. A reset portion 184 of the curve 180 is used to reset the switching element 114 to a high resistance state.

The set curve 182 is of relatively lower magnitude and relatively longer duration than the reset curve 184. Exemplary resistance values for the switching element 114 may be on the order of $R_{MIN}$=1 kΩ when in the set (closed) condition, and $R_{MAX}$=1 MΩ for the reset (open) condition. Both of the set and reset curves 182, 184 are of lower magnitude than a lower programming threshold $I_P$ 186 for the memory element 112. In some embodiments, the current magnitude of the $I_{RESET}$ curve 184 may be on the order of about 200 μA (200×10⁻⁶ A), and the current magnitude of the $I_P$ threshold 186 may be on the order of about 300 μA.

Figure 6A:
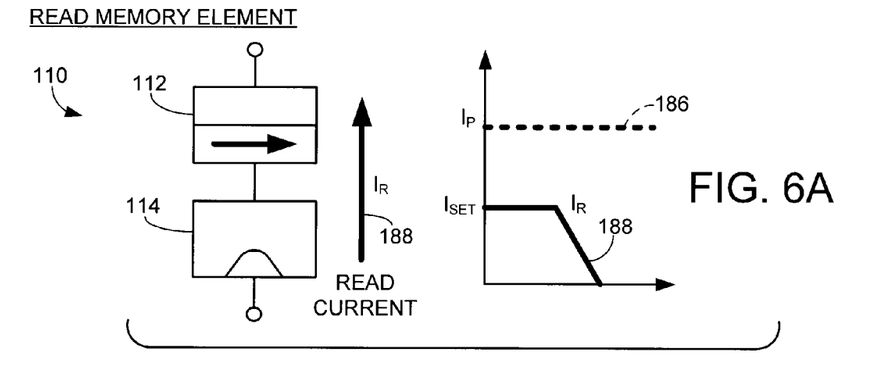
FIGS. 6A-6C show respective steps carried out in accordance with various embodiments to read and write the memory cell.
Figure 6B:
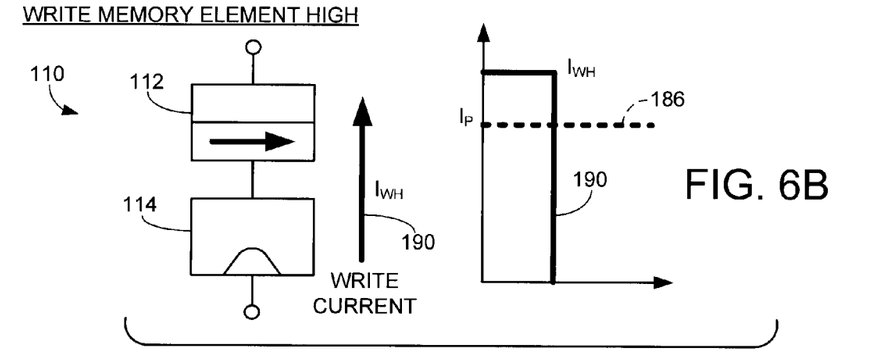
Figure 6C:
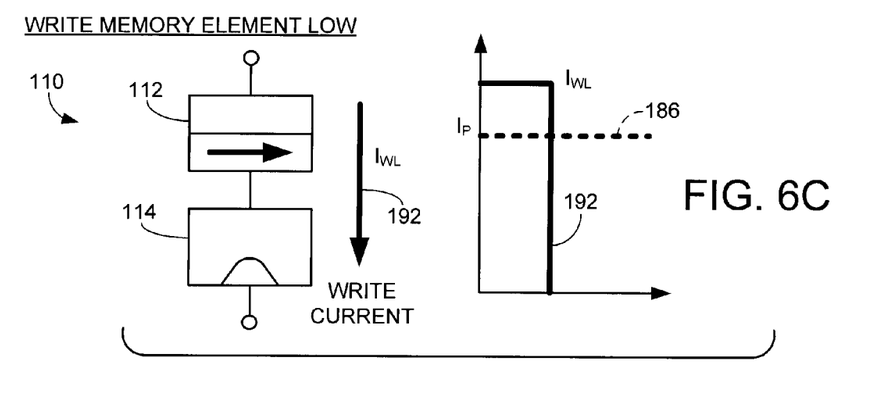

Read and write operations upon a selected memory element 110 can be carried out in accordance with FIGS. 6A-6C. FIG. 6A shows a read operation in which a read current 188 is applied through the memory cell 110. The read current 188 is sufficient to place the switching element 114 into the low resistive state without altering the existing programmed state of the memory element 112.

In some embodiments, the voltage drop across the memory cell 110 due to the read current 188 can be sensed by a sense amplifier (not shown). In other embodiments, a self-reference read operation can be used. Exemplary resistances of the memory element 112 when programmed to the low resistive state may be on the order of around 2,000 to 3,000 ohms (2 kΩ to 3 kΩ). Exemplary resistances of the memory element 112 in the high resistive state may be on the order of around 1MΩ (10⁶Ω).

As desired, the switching element 114 can be returned to the high programmed resistive state at the conclusion of the read operation. In some embodiments, the normal state of the switching element 114 is selected in relation to the programmed state of the memory element 112 so that at least one of the elements 112, 114 is maintained at a high resistive state to reduce leakage currents. In such case, if the memory element 112 is found to be programmed high, the switching element 112 may be left in the low resistive state following a read operation.

It will be noted that the read current 188 applied to the memory cell 110 in FIG. 6A can be alternatively applied in a direction opposite to the direction shown. A unipolar nature of the switching element 114 allows the switching element to be set to the respective high and low resistive states using currents flowing in either direction through the element. This feature will be discussed more fully in FIGS. 6B and 6C, which illustrates a manner in which write operations can be carried out upon the memory element 112.

In FIG. 6B, a first write current $I_{WH}$ 190 is applied to the memory cell 110 to place the memory element 112 in the high resistive state. The write current 190 has a magnitude greater than the $I_P$ threshold 186 and is of sufficient magnitude and pulse width to set the programming state of the memory element 112, such as the anti-parallel state for the MTJ of FIG. 2C.

In some embodiments, the write current 190 operates to concurrently place the switching element 114 in a low resistance state. For example, the write current 190 may melt the phase change layer 172 (FIGS. 4A-4B) sufficient to facilitate the programming of the memory element 112 using a single applied current. In other embodiments, a separate switching current can be applied as depicted in FIG. 6A to first place the switching element 114 in the low resistive state prior to application of the write current 190. In either case, it is contemplated that the applied write current 190 will be sufficiently abrupt in duration to automatically result in the switching element 114 being set to the high resistive state at the conclusion of the write operation.

In FIG. 6C, a second write current $I_{WL}$ 192 is applied to the memory cell 110 to place the memory element 112 in the low resistive state. The second write current 192 is in the opposite direction of the first write current 190. As before, the write current 192 may temporarily transition the switching device 114 to the low resistive state, or a separate switch programming current may be applied prior to the write current 192.

The write current 192 will also automatically set the switching element 114 to the high resistive state at the conclusion of the write operation.

Figure 7:
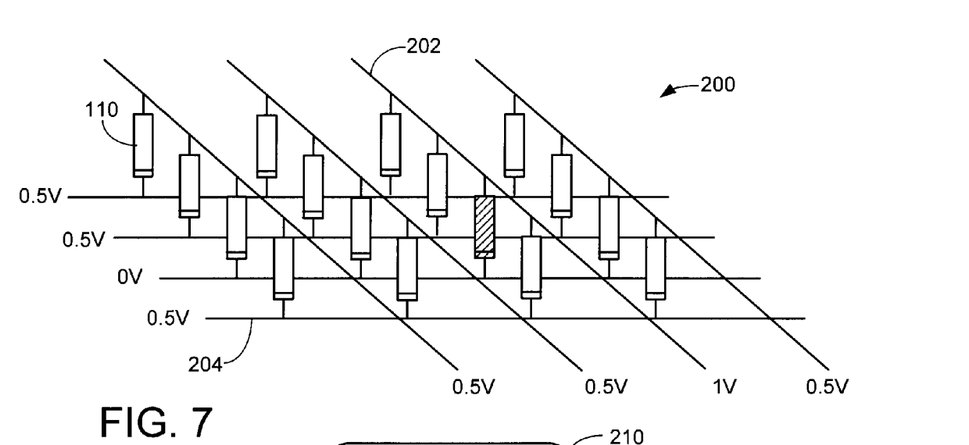
FIG. 7 is a schematic representation of a cross point array utilizing the memory cells of FIGS. 2A-2B.

FIG. 7 schematically depicts a cross-point array 200 formed from a number of the memory cells 110. The memory cells 110 are respectively connected between a first set of parallel upper control lines 202 and a lower set of parallel control lines 204. Access to individual cells 110, such as for a selected cell 110A (shown with cross-hatched pattern), can be carried out by setting the upper and lower control lines at the cross point of the selected cell to a selected voltage potential, such as 1.0V and 0V as shown, and then driving the selected lines with the appropriate current pulses to write and read data as set forth above.

The remainder of the upper and lower control lines 202, 204 are set to a different suitable value, such as a value that is half that of the applied potential (e.g., 0.5V as shown). This voltage differential will be sufficient to allow individual read and write access to the selected cell without interference from adjacent cells along the selected lines, and without inadvertently affecting the programmed state of such adjacent cells. This is because all cross points in the array will have high resistance ($>R_{MAX}$) due to the high resistance programmed state of the memory cell 112 and/or the switching device 114.

Figure 8:
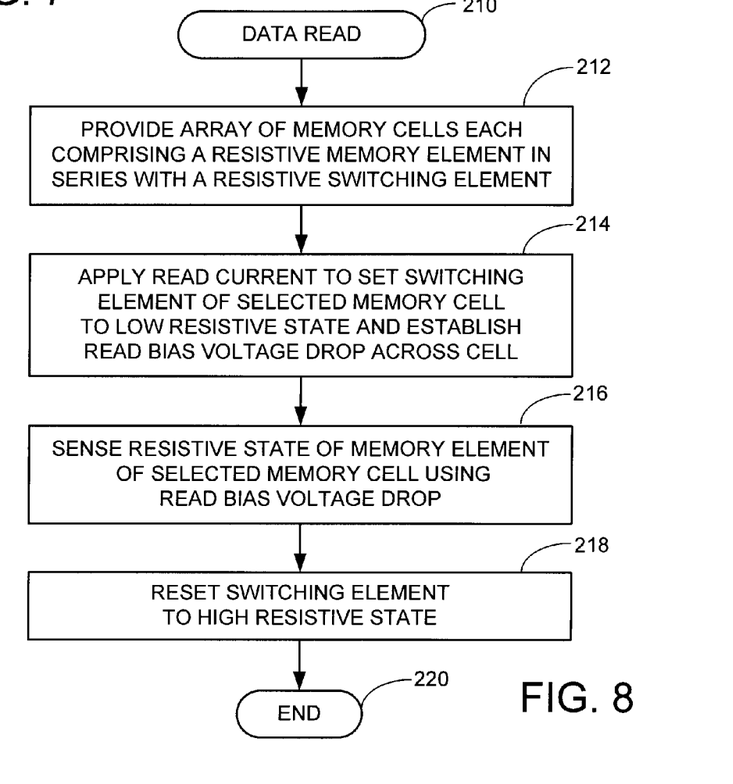
FIG. 8 is a READ ROUTINE illustrative of steps carried out in accordance with various embodiments of the present invention.

FIG. 8 sets forth a DATA READ routine 210 illustrative of various steps carried out in accordance with the foregoing discussion. An array of memory cells is initially provided at step 202 such as the cross point array 200 in FIG. 7. Each memory cell includes a bipolar memory element in series with a switching element, such as the elements 112, 114 discussed above. A suitable read current is applied at step 204 to set the switching element 114 to the low resistive state, such as discussed in FIG. 6A. In some embodiments, this read current further establishes a voltage drop across the cell which is sensed at step 216 to read the programmed state of the memory element 112. As desired, the switching element is then reset to the high resistance state at step 218, and the routine ends at step 220.

A number of read schemes can be carried out during the read routine of FIG. 8. With reference again to FIG. 8, in an N×N array of memory cells where voltages of 0.5V are applied to the non-selected upper and lower control lines 202, 204, let a voltage V1=0.5+ΔV represent the voltage applied to the upper control line 202 coupled to the selected memory cell, and a voltage V2=0.5−ΔV represent the voltage applied to the lower control line 204 coupled to the selected memory cell. When the memory element 112 is programmed to the low resistance $R_{MIN}$, the read current $I_{CELL}$ through the selected cell 110 will be:

$$I_{CELL} = \frac{2\Delta V}{R_{MIN}} + (N-1)\frac{\Delta V}{1M\Omega} \quad (1)$$

The read current $I_{CELL}$ through the selected cell 110 when the memory element 112 is programmed to the high resistance $R_{MAX}$ will be:

$$I_{CELL} = \frac{2\Delta V}{R_{MAX}} + (N-1)\frac{\Delta V}{1M\Omega} \quad (2)$$

Suitable sense circuitry can be provided to distinguish between the respective current magnitudes of equations (1) and (2) to determine the programmed state of the memory element 112.

Figure 9:
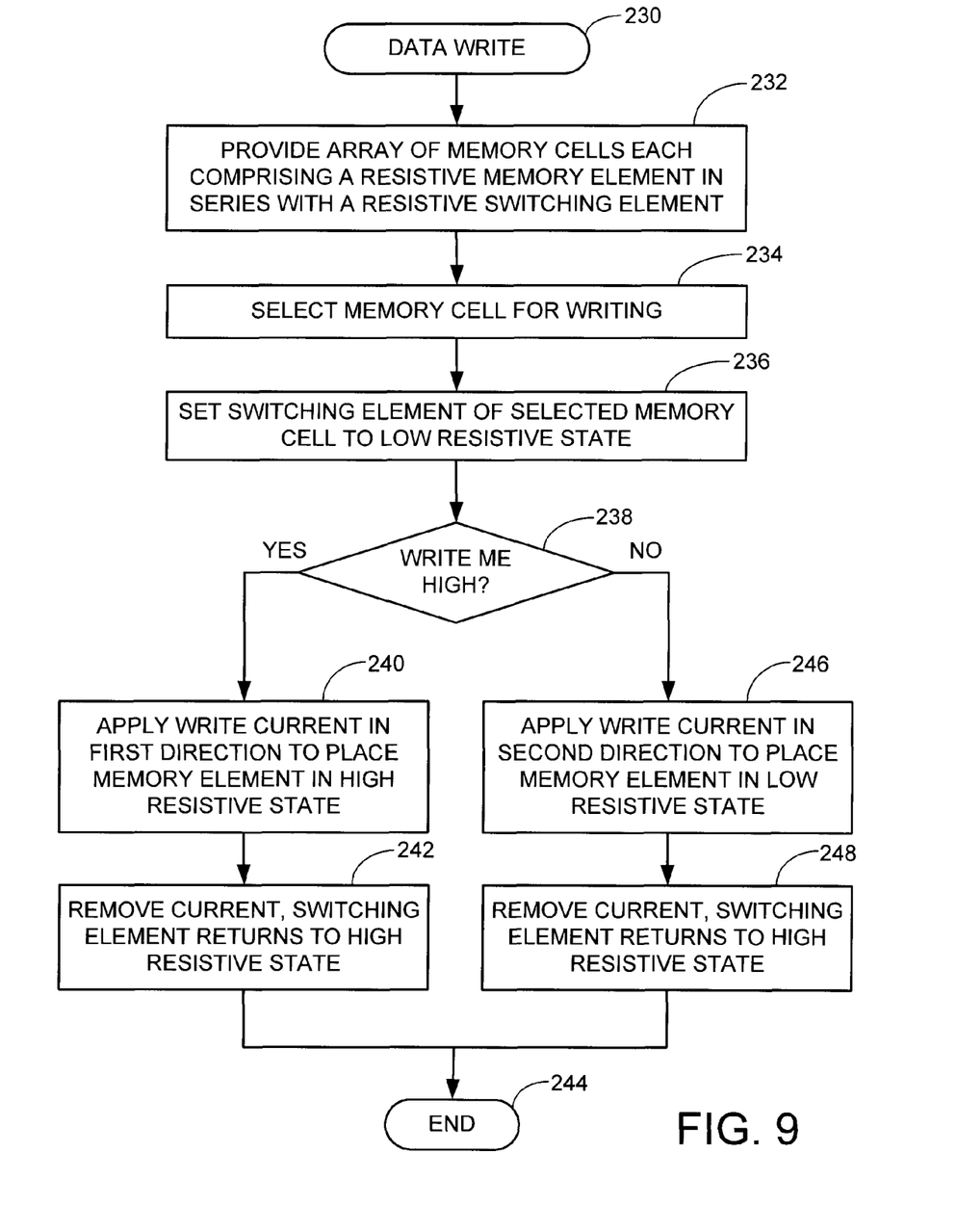
FIG. 9 is a WRITE ROUTINE illustrative of steps carried out in accordance with various embodiments of the present invention.

FIG. 9 shows a DATA WRITE routine 230 illustrative of steps carried out in accordance with the foregoing discussion. As with step 202 in FIG. 8, an array of memory cells is provided at step 232 with each memory cell 110 comprising a bipolar memory element such as 112 in series with a switching element such as 114.

A selected memory cell in the array is selected for a write operation at step 234. In some embodiments, this is followed by application of a suitable switch programming current to place the switching element 114 in a low resistive state, step 236.

Decision step 238 determines whether the program state to be written to the memory cell 110 is high; if so, the flow continues to step 240 where a write current is applied in a first direction to place the memory element 112 in the high resistive state, as shown in FIG. 6B. Removal of the write current results in the switching element 114 being returned to the high resistive state, as shown by step 242, after which the routine ends at 244.

When the program state to be written is low, the flow passes from decision step 238 to step 246 where a second write current is applied in a second direction opposite the first direction, such as shown in FIG. 6C. Removal of the write current returns the switching element 114 to the low resistive state at step 248, after which the routine ends at 244.

As will be appreciated by one skilled in the art, the various embodiments illustrated herein provide a novel memory cell structure that can be efficiently programmed and sensed in a manner as described herein. The use of a bipolar resistive memory element with a switching element allows for scaleable memory cells that can be reliably programmed with predetermined pulse profile sequences. The elimination of integrated switching devices such as MOSFETs reduces the complexity of the array by eliminating the need for separate source, bit and word lines to access the individual cells. A variety of different element constructions can be utilized, including but not limited to PMC, RRAM and PCRAM constructions for the respective memory and switching elements. It is contemplated that reduced power consumption levels and improved data throughput rates can also be achieved.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising providing a programmable bipolar volatile resistive sense memory element connected in series with a unipolar non-volatile programmable resistive switching element; applying a write current to concurrently place the memory element in a selected resistive state and the switching element in a high resistive state.

2. The method of claim 1, wherein the memory element is programmable to different resistive states responsive to application of corresponding bipolar write currents in opposing directions through the memory cell, and wherein the switching element is programmable to different resistive states by application of corresponding unipolar write currents in a common direction through the memory cell.

3. The method of claim 1, wherein the memory element is configured to be selectively programmed to a high resistive state responsive to application of a first write current in a first direction through the memory cell and configured to be selectively programmed to a low resistive state responsive to application of a second write current in a second direction through the memory cell opposite the first direction, and wherein the switching device is programmed to the high resistive state by each of the respective first and second write currents.

4. The method of claim 3, wherein the switching device is further configured to be selectively programmed to a low resistive state responsive to a third write current in either the first or second directions.

5. The method of claim 1, wherein the memory element is characterized as a magnetic tunneling junction (MTJ) with a reference layer having a fixed magnetic orientation direction and a free layer having a selectively programmable magnetic orientation direction.

6. The method of claim 1, wherein the memory element is characterized as a programmable metallization cell (PMC).

7. The method of claim 1, wherein the switching element comprises a phase change layer that transitions between an amorphous phase and a crystalline phase.

8. The method of claim 6, wherein the programmable metallization cell (PMC) has a shaped filament layer that focuses electron migration to a predetermined region.

9. The method of claim 1, wherein the switching element comprises a thin film layer of $NiO_x$, $TiO_x$, $CuO_x$, $NbO_x$, $TaO_x$, or $Nb:SrTiO_3$.

10. The method of claim 1, wherein the memory element and the switching element form a stack of semiconductor layers, and wherein a barrier layer is interposed between the memory element and the switching element within the stack.

11. The method of claim 1, wherein the switching element is programmed with a current flowing in a single direction.

12. The method of claim 1, wherein the switching element can be selectively programmed with a current flowing in opposing directions through the switching element.

13. A method comprising:
providing a non-volatile memory cell comprising a programmable bipolar resistive sense memory element connected in series with a unipolar programmable resistive switching element;
programming the memory element in a selected resistive state by applying a write current through the memory cell, the write current placing the switching element in a high resistive state; and
selecting a switching resistive state for the switching element in relation to the selected resistive state of the memory element to maintain at least one of the memory and switching elements in a high resistive state to reduce leakage current.

14. The method of claim 13, wherein the memory element is programmable to different resistive states responsive to application of corresponding bipolar write currents in opposing directions through the memory cell, and wherein the switching element is programmable to different resistive states by application of corresponding unipolar write currents in a common direction through the memory cell.

15. The method of claim 13, wherein the memory element is configured to be selectively programmed to a high resistive state responsive to application of a first write current in a first direction through the memory cell and configured to be selectively programmed to a low resistive state responsive to application of a second write current in a second direction through the memory cell opposite the first direction, and wherein the switching device is programmed to the high resistive state by each of the respective first and second write currents.

16. The method of claim 15, wherein the switching device is further configured to be selectively programmed to a low resistance state responsive to a third write current in either the first or second directions, wherein the third write current is applied before the programming step.

17. The method of claim 13, wherein the switching element comprises a phase change layer that transitions between an amorphous phase and a crystalline phase.

18. The method of claim 13, wherein the resistive sense memory element is characterized as a programmable metallization cell (PMC) and has a shaped filament layer that focuses electron migration to a predetermined region.

19. The method of claim 13, further comprising:
reading the non-volatile memory cell by:
applying a read current to program the switching element to a low resistive state and establish a read bias voltage drop;
sensing a resistive state of the non-volatile memory cell by utilizing the read bias voltage drop; and
resetting the switching element high resistive state.

* * * * *